United States Patent
Bell, Jr. et al.

(10) Patent No.: US 8,205,136 B2
(45) Date of Patent: *Jun. 19, 2012

(54) FAULT TOLERANT ENCODING OF DIRECTORY STATES FOR STUCK BITS

(75) Inventors: Robert H. Bell, Jr., Austin, TX (US);
Guy L. Guthrie, Austin, TX (US);
William J. Starke, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 981 days.

This patent is subject to a terminal disclaimer.

(21) Appl. No.: 12/189,808

(22) Filed: Aug. 12, 2008

(65) Prior Publication Data

US 2008/0301531 A1    Dec. 4, 2008

Related U.S. Application Data

(63) Continuation of application No. 11/225,570, filed on Sep. 13, 2005, now Pat. No. 7,533,321.

(51) Int. Cl.
*G11C 29/00*    (2006.01)
(52) U.S. Cl. ........ 714/763; 714/699; 714/768; 711/113; 711/118; 711/167
(58) Field of Classification Search .................. 714/763, 714/699, 768; 711/113, 118, 167
See application file for complete search history.

(56) References Cited

U.S. PATENT DOCUMENTS

| 5,604,753 | A | 2/1997 | Bauer et al. | |
|---|---|---|---|---|
| 5,897,651 | A * | 4/1999 | Cheong et al. | 711/3 |
| 6,023,764 | A | 2/2000 | Curtis | |
| 6,085,288 | A | 7/2000 | Arimilli et al. | |
| 6,480,975 | B1 | 11/2002 | Arimilli et al. | |
| 6,802,039 | B1 | 10/2004 | Quach et al. | |
| 7,069,494 | B2 | 6/2006 | Cargnoni et al. | |
| 7,120,836 | B1 | 10/2006 | Englin et al. | |
| 7,272,773 | B2 | 9/2007 | Cargnoni et al. | |
| 7,533,321 | B2 * | 5/2009 | Bell, Jr. et al. | 714/763 |

* cited by examiner

*Primary Examiner* — Guy Lamarre
(74) *Attorney, Agent, or Firm* — Matthew W. Baca; Jack V. Musgrove

(57) ABSTRACT

A method of handling a stuck bit in a directory of a cache memory, by defining multiple binary encodings to indicate a defective cache state, detecting an error in a tag stored in a member of the directory (wherein the tag at least includes an address field, a state field and an error-correction field), determining that the error is associated with a stuck bit of the directory member, and writing new state information to the directory member which is selected from one of the binary encodings based on a field location of the stuck bit within the directory member. The multiple binary encodings may include a first binary encoding when the stuck bit is in the address field, a second binary encoding when the stuck bit is in the state field, and a third binary encoding when the stuck bit is in the error-correction field. The new state information may also further be selected based on the value of the stuck bit, e.g., a state bit corresponding to the stuck bit is assigned a bit value from the new state information which matches the value of the stuck bit.

18 Claims, 5 Drawing Sheets

| 0 | 1 | 4 | 5 | 6 7 | 8 | | 35 | 36 | 37 | 40 | 41 | 47 |
|---|---|---|---|---|---|---|---|---|---|---|---|---|
| spr | incl | | $V_0$ | addr spr | address(20:47) | | | $V_1$ | state | | ecc | |

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 | 46 | 47 |
|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|
| | X | | X | X | X | | | X | X | X | X | X | | | | | | X | | | | X | | | X | X | | | | | X | | | X | | X | | | X | X | X | | | | | | | |
| | | X | | | | | | | X | X | X | X | X | | | | | X | | | X | | | X | | X | X | | X | X | | X | X | | | X | | X | X | | | | X | | | | | |
| | | | X | X | | | | X | X | X | X | X | X | | | X | X | | | X | | X | | | | X | X | | | X | X | | X | X | | X | X | | | | | | X | | | | | |
| X | | X | | | X | X | | | X | X | | | X | X | X | | X | X | | X | X | | | | | X | | X | X | | | X | | | X | | X | | | | | | X | | | | |
| | X | | X | | | X | X | X | | | X | | | X | X | X | | X | X | | | | X | | X | | | X | | X | | | | | | | | | | | | | X | | | |
| X | | | | | X | X | X | X | | | | X | X | | | X | X | | | X | X | | | X | X | X | X | | | X | | | X | | | X | | | X | | | | | X | | | |
| | | X | X | X | X | X | X | X | X | | | | | | | | X | | | | X | | | | X | | X | | | X | | | X | | X | | | X | X | X | | | | | | | X |

FAULT TOLERANT ENCODING OF DIRECTORY STATES FOR STUCK BITS

CROSS-REFERENCE TO RELATED APPLICATION

This application is a continuation of U.S. patent application Ser. No. 11/225,570 filed Sep. 13, 2005, now U.S. Pat. No. 7,533,321, and is related to U.S. patent application Ser. No. 11/225,640 filed Sep. 13, 2005, now U.S. Pat. No. 7,689,891, which is hereby incorporated.

BACKGROUND OF THE INVENTION

1. Field of the Invention

The present invention generally relates to computer systems, and more particularly to error detection and correction in a cache memory of a computer processing unit.

2. Description of the Related Art

The basic structure of a conventional symmetric multiprocessor computer system 10 is shown in FIG. 1. Computer system 10 has one or more processing units arranged in one or more processor groups; in the depicted system, there are four processing units 12a, 12b, 12c and 12d in processor group 14. The processing units communicate with other components of system 10 via a system or fabric bus 16. Fabric bus 16 is connected to one or more service processors 18a, 18b, a system memory device 20, and various peripheral devices 22. A processor bridge 24 can optionally be used to interconnect additional processor groups. System 10 may also include firmware (not shown) which stores the system's basic input/output logic, and seeks out and loads an operating system from one of the peripherals whenever the computer system is first turned on (booted).

System memory device 20 (random access memory or RAM) stores program instructions and operand data used by the processing units, in a volatile (temporary) state. Peripherals 22 may be connected to fabric bus 16 via, e.g., a peripheral component interconnect (PCI) local bus using a PCI host bridge. A PCI bridge provides a low latency path through which processing units 12a, 12b, 12c and 12d may access PCI devices mapped anywhere within bus memory or I/O address spaces. The PCI host bridge interconnecting peripherals 22 also provides a high bandwidth path to allow the PCI devices to access RAM 20. Such PCI devices may include a network adapter, a small computer system interface (SCSI) adapter providing interconnection to a permanent storage device (i.e., a hard disk), and an expansion bus bridge such as an industry standard architecture (ISA) expansion bus for connection to input/output (I/O) devices including a keyboard, a graphics adapter connected to a display device, and a graphical pointing device (mouse) for use with the display device. The service processors can alternately reside in a modified PCI slot which includes a direct memory access (DMA) path.

In a symmetric multi-processor (SMP) computer, all of the processing units 12a, 12b, 12c and 12d are generally identical, that is, they all use a common set or subset of instructions and protocols to operate, and generally have the same architecture. As shown with processing unit 12a, each processing unit may include one or more processor cores 26a, 26b which carry out program instructions in order to operate the computer. An exemplary processing unit includes the POWER5™ processor marketed by International Business Machines Corp. which comprises a single integrated circuit superscalar microprocessor having various execution units, registers, buffers, memories, and other functional units, which are all formed by integrated circuitry. The processor cores may operate according to reduced instruction set computing (RISC) techniques, and may employ both pipelining and out-of-order execution of instructions to further improve the performance of the superscalar architecture.

Each processor core 26a, 26b includes an on-board (L1) cache (typically, separate instruction and data caches) implemented using high speed memory devices. Caches are commonly used to temporarily store values that might be repeatedly accessed by a processor, in order to speed up processing by avoiding the longer step of loading the values from system memory 20. A processing unit can include another cache such as a second level (L2) cache 28 which, along with a memory controller 30, supports both of the L1 caches that are respectively part of cores 26a and 26b. Additional cache levels may be provided, such as an L3 cache 32 which is accessible via fabric bus 16. Each cache level, from highest (L1) to lowest (L3) can successively store more information, but at a longer access penalty. For example, the on-board L1 caches in the processor cores might have a storage capacity of 128 kilobytes of memory, L2 cache 28 might have a storage capacity of 4 megabytes, and L3 cache 32 might have a storage capacity of 32 megabytes. To facilitate repair/replacement of defective processing unit components, each processing unit 12a, 12b, 12c, 12d may be constructed in the form of a replaceable circuit board, pluggable module, or similar field replaceable unit (FRU), which can be easily swapped, installed in, or swapped out of system 10 in a modular fashion.

A cache has many memory blocks which individually store the various instructions and data values. The blocks in any cache are divided into groups of blocks called sets or congruence classes. A set is the collection of cache blocks that a given memory block can reside in. For any given memory block, there is a unique set in the cache that the block can be mapped into, according to preset mapping functions. The number of blocks in a set is referred to as the associativity of the cache, e.g. 2-way set associative means that for any given memory block there are two blocks in the cache that the memory block can be mapped into; however, several different blocks in main memory can be mapped to any given set. A 1-way set associate cache is direct mapped, that is, there is only one cache block that can contain a particular memory block. A cache is said to be fully associative if a memory block can occupy any cache block, i.e., there is one congruence class, and the address tag is the full address of the memory block.

An exemplary cache line (block) includes an address field, a state bit field, an inclusivity bit field, and a value field for storing the actual program instruction or operand data. The state bit field and inclusivity bit fields are used to maintain cache coherency in a multiprocessor computer system (to indicate the validity of the value stored in the cache). The address field is a subset of the full address of the corresponding memory block. A compare match of an incoming address with one of the address fields (when the state field bits designate this line as currently valid in the cache) indicates a cache "hit." The collection of all of the address fields in a cache (and sometimes the state bit and inclusivity bit fields) is referred to as a directory, and the collection of all of the value fields is the cache entry array.

When all of the blocks in a congruence class for a given cache are full and that cache receives a request, whether a read or write operation, to a memory location that maps into the full congruence class, the cache must "evict" one of the blocks currently in that class. The cache chooses a block by one of a number of means known to those skilled in the art (least recently used (LRU), random, pseudo-LRU, etc.) to be evicted. If the data in the chosen block is modified, that data is written to the next lowest level in the memory hierarchy which may be another cache (in the case of the L2 or on-board cache) or main memory (in the case of an L3 cache, as depicted in the three-level architecture of FIG. 1). If the data in the chosen block is not modified, the block can optionally be abandoned and not written to the next lowest level in the memory hierarchy, i.e., if the next lower level is system memory the non-modified line is abandoned; if the next level in the hierarchy is another cache, the shared copy can be moved. At the end of this process, the cache no longer holds a copy of the evicted block.

The control logic for a cache memory, and in particular a cache directory, may include error correction code (ECC) circuits to handle errors that arise in a cache line. A bit in a given cache block may contain an incorrect value either due to a soft error (such as stray radiation or electrostatic discharge) or to a hard error (a defective cell). ECCs can be used to reconstruct the proper data stream. Some ECCs can only be used to detect double-bit errors and correct single-bit errors, i.e., if two bits in a particular block are invalid, then the ECC will not be able to determine what the proper data stream should actually be, but at least the failure can be detected. Other ECCs are more sophisticated and even allow detection of triple-bit errors and correction of double errors. These latter errors are costly to correct, but the design tradeoff is to halt the machine when double-bit (uncorrectable) errors occur.

These ECC circuits are one way to deal with soft errors arising in memory cells. Another approach used for dealing with hard errors is to provide redundancy within the arrays (directory, LRU, cache). When a cache chip is fabricated, it can be tested to determine if there are any defective row or column lines in each of the arrays (row and column lines are tested for the entire cache, directory, and LRU). If an array is defective, a fuse can be permanently blown to indicate its defective nature. A comparison is then made inside the array for each accessed address to see if it matches with a defective address. If so, appropriate logic re-routes the address to one of many extra row and column lines formed on the chip, i.e., from redundant bit lines (columns) and word lines (rows). The number of extra bit and word lines may vary depending upon the defect rate and desired chip yield. For a low-defect (larger physical size) cache, two extra lines might be provided for every 256 regular lines, while in a high-defect (smaller physical size) cache, two extra lines might be provided for every eight regular lines.

With advancements in chip fabrication and computer configurations, L2 and L3 caches are increasing in size, requiring larger on-chip directories and on-chip (or off-chip) data cache entry arrays. These larger, dense arrays decrease the reliability of the overall chip/system due to increased chances of defects that occur in manufacturing or in the field. In order to increase the reliability of these larger directory/data caches, many different means have been traditionally employed to address these problems, such as in-line parity or ECC detection/correction, but there are several disadvantages and limitations with the foregoing approaches. While soft errors (i.e., intermittent faults) are correctable using ECC circuits that repair and re-write the data in the directory, this technique does not solve hard faults where a cache directory bit is stuck either high or low. This situation is particularly problematic when the stuck bit is one of the coherency (state) bits that are supposed to indicate the validity of the line. In-line ECC correction can be used to correct stuck faults, but this approach penalizes access time to the array, since correction is needed with each access, and repeatedly consumes part of the error correction capability. The use of redundant cache lines can partially overcome hard faults, but these redundant structures are wasteful as they take up valuable space on the chip or system board and generally require the machine to be re-booted for them to take effect. Redundancy is also limited in its ability to correct a large number of defects. Moreover, hard errors that arise after testing may not be correctable using redundant lines. When these types of hard faults occur, conventional ECC circuits that try to repair and re-write the data will lead to a situation wherein the system repetitively attempts to correct the error without success. In this situation, the machine cannot recover and must be brought down and repaired, costing customers time and money, if full error correction and detection resources are to be maintained.

In light of the foregoing, it would be desirable to devise an improved method of handling hard errors that arise in a cache directory. It would be further advantageous if the method could be implemented without requiring wasteful redundant circuitry or in-line correction which penalizes directory access time and consequently degrades system performance.

SUMMARY OF THE INVENTION

It is therefore one object of the present invention to provide an improved method of handling stuck bits in a cache directory of a computer processing unit.

It is another object of the present invention to provide such a method that does not unduly penalize directory access time during normal cache operation.

It is yet another object of the present invention to provide a method for fault tolerant encoding of directory states which facilitates handling of stuck bits in a cache directory.

The foregoing objects are achieved in a method of handling a stuck bit in a directory of a cache memory, by defining multiple binary encodings to indicate a defective cache state, detecting an error in a tag stored in a member of the directory (wherein the tag at least includes an address field, a state field and an error-correction field), determining that the error is associated with a stuck bit of the directory member, and writing new state information to the directory member which is selected from one of the binary encodings based on a field location of the stuck bit within the directory member. In the illustrative implementation, the directory includes cache eviction logic to select a member for use with a new cache operation, and the cache eviction logic excludes the directory member from future usage based on the new state information. The multiple binary encodings may include a first binary encoding used for the new state information when the stuck bit is in the address field, a second binary encoding used for the new state information when the stuck bit is in the state field, and a third binary encoding used for the new state information when the stuck bit is in the error-correction field. The new state information may also further be selected based on a value of the stuck bit, i.e., whether the stuck bit is stuck high ("1") or low ("0"). If the stuck bit is in the state field, the new state information is selected between a first binary encoding and a second binary encoding having bits that are inverted with respect to the first encoding, such that a state bit corresponding to the stuck bit is assigned a bit value from the new state information which matches the value of the stuck bit.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present invention is directed to an improved method for handling a stuck bit (hard fault) in a cache directory that renders a member of the cache directory permanently defective. According to this novel method and as further explained below, any valid memory block corresponding to the defective member is corrected as it is moved out of the affected cache, and the directory member is marked as being defective so that it is no longer used in future cache operations. In this manner, the invention protects the integrity of all program instructions and operand data residing in the cache while disabling future use of the faulty directory member location. The method can be carried out as needed during normal operation of the cache memory and so is particularly useful in handling stuck bits that arise in the field, after factory testing or system boot up.

Figure 1:
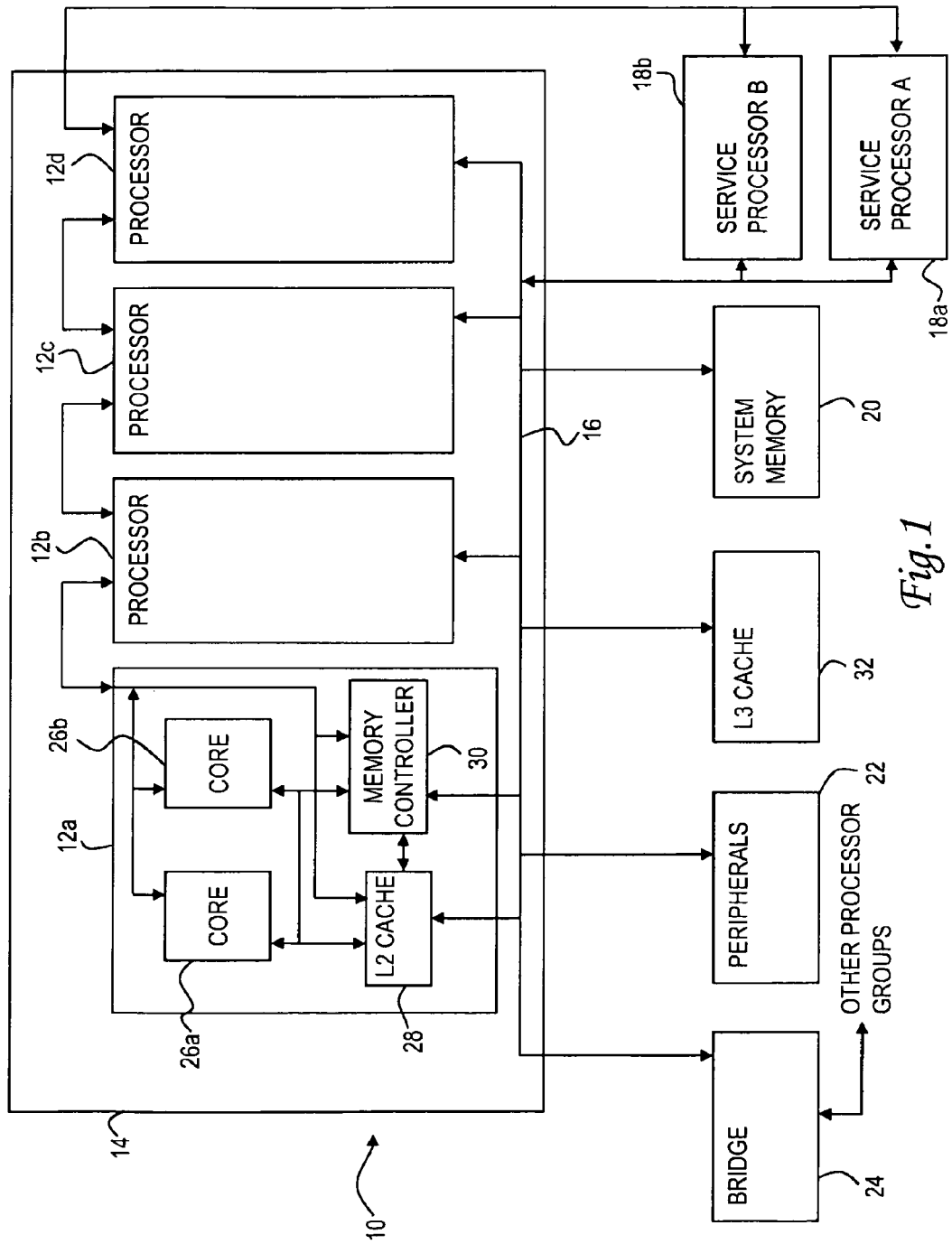
FIG. 1 is a block diagram depicting a conventional symmetric multi-processor (SMP) computer system having generally identical processing units with cache memories.
Figure 2:
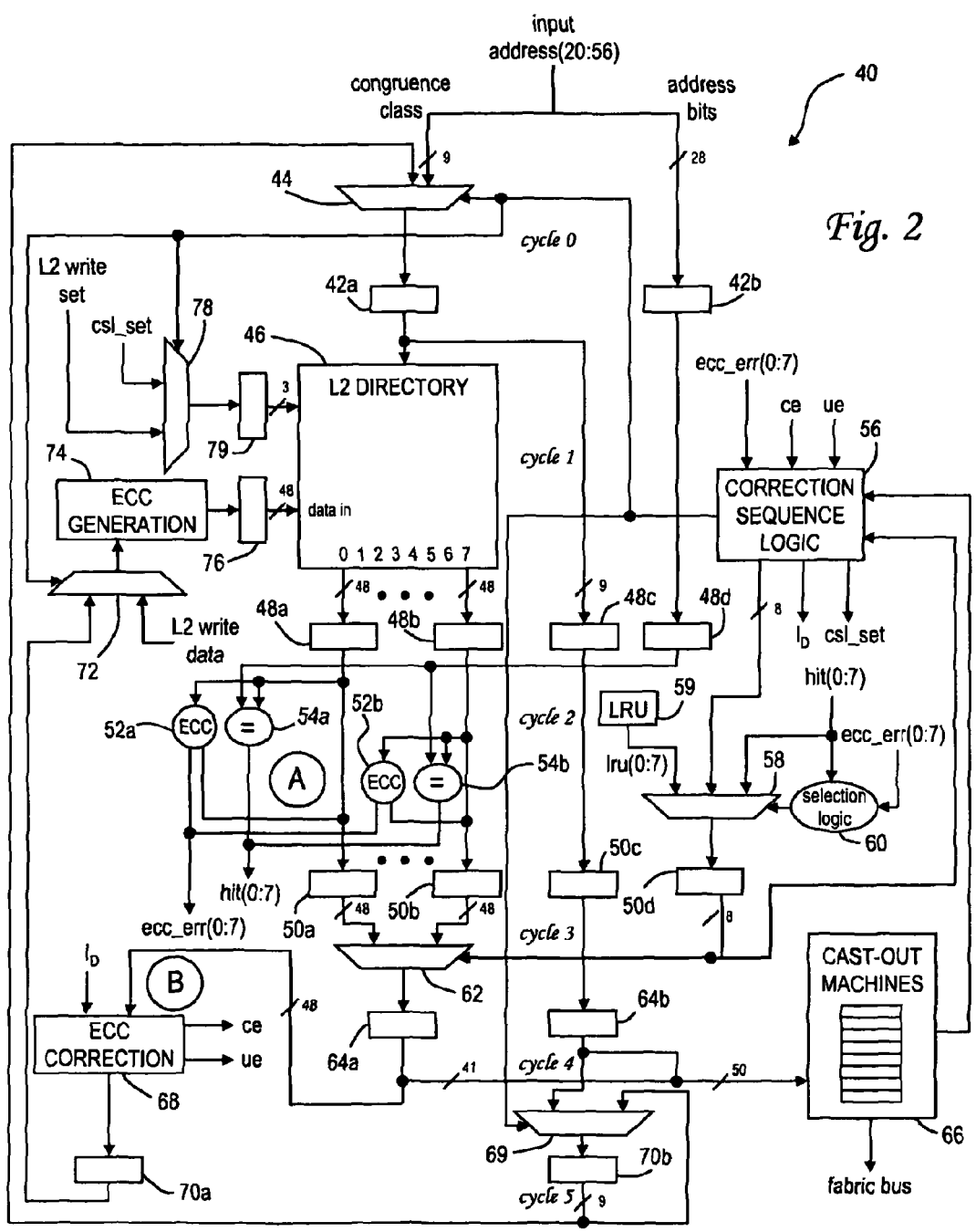
FIG. 2 is a high-level schematic diagram of a set-associative cache directory having error recovery circuitry adapted to handle stuck bits in accordance with one embodiment of the present invention.

With reference now to the figures, and in particular with reference to FIG. 2, there is depicted a cache directory 40 having error recovery circuitry constructed in accordance with one embodiment of the present invention. Cache directory 40 utilizes a plurality of clock-controlled latches for timing of the error recovery process, i.e., to synchronize the flow of data and control signals. These latches represent latency boundaries between different cycles in the pipelined structure of cache directory 40. In this implementation, there are six different stages or cycles in the pipeline, denoted in FIG. 2 from top to bottom as cycles 0-5. These six stages generally correspond to: cycle 0—input address for directory operation; cycle 1—directory access; cycle 2—ECC check and address comparison; cycle 3—directory member selection; cycle 4—dispatch or error correction; cycle 5—corrected data available for repair sequence.

Figures 3, 4:
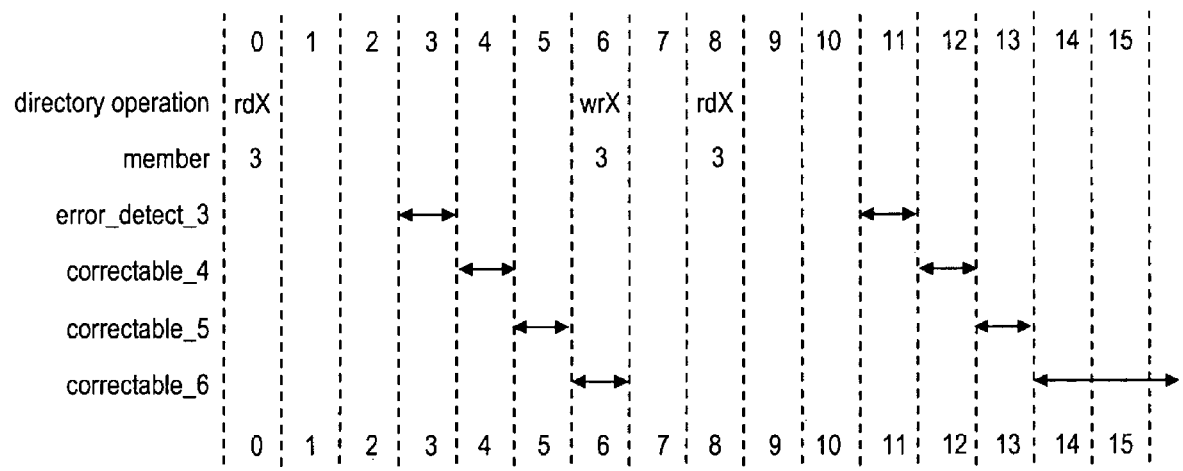
FIG. 3 is a pictorial representation of the different fields in a tag for a given member of the cache directory of FIG. 2 in accordance with one implementation of the present invention.
FIG. 4 is a timing diagram for the correction phase of the error recovery process in accordance with one implementation of the present invention.

Cycle 0 represents the initiation of a directory operation, which begins by passing an address addr(20:56) for a requested cache line to directory 40. Cache directory 40 is preferably 8-way set associative, so the address includes two parts: (i) a congruence class field to define which set is to be used for the operation, and (ii) the remaining address information needed to uniquely identify the cache line, which is stored in the directory member. The format of the address may vary considerably; in the illustrative embodiment the format includes nine address bits addr(48:56) used for the congruence class which correspond to a subset of the physical address of the associated memory block, and 28 address bits addr(20:47). These 28 address bits are combined with other fields such as inclusivity bits, state bits, and error-correction code (ECC) bits to form a 48-bit tag which is stored in the directory. FIG. 3 illustrates one example of bit assignments for this 48-bit tag. Bit 0 is a spare bit set aside for future usage. Bits 1:4 are used to indicate inclusivity. Bit 5 is a special state bit provided in accordance with the one implementation of the present invention which is used to check the validity of the data and denoted herein as $V_0$. Bits 6:7 are provided as spare address bits. Bits 8:35 are address bits addr(20:47) which correspond to a different subset of the physical address of the associated memory block. Bit 36 is another special state bit used to check the validity of the data and denoted herein as $V_1$. Bits 37:40 are state/coherency bits. Bits 41:47 are ECC bits. These specific bit assignments are arbitrary and should not be construed in a limiting sense.

The address addr(20:56) is transmitted from a requesting processor core or system bus master to cache directory 40 via an inter-cache bus and/or a fabric bus. The congruence class bits pass through a multiplexer 44 and are stored in latch 42a. The address bits are stored in latch 42b. The output of latch 42a passes to a directory array 46 during cycle 1. The congruence class information (index) is used by directory array 46 to select a corresponding set of eight members for output to a set of eight latches, two of which 48a and 48b are shown in FIG. 2. During cycle 1, the index bits also pass from latch 42a to another latch 48c, and the input address bits pass from latch 42b to another latch 48d.

During cycle 2 the eight tags (minus the ECC check bits) pass from the directory latches to another set of latches, two of which 50a and 50b are shown, and the index bits pass from latch 48c to latch 50c. ECC checks and address comparisons are also performed during cycle 2. Each of the eight outputs from directory array 46 are connected via the latches to respective pairs of ECC checkers and comparators in the circuit region labeled "A" in FIG. 2. Only two of these pairs are shown for simplicity: the output of latch 48a is connected to ECC checker 52a and comparator 54a, and the output of latch 48b is connected to ECC checker 52b and comparator 54b. Each ECC checker outputs a single bit which indicates whether any error was detected for that directory member, and provides an ECC check syndrome synd(0:6) that is fed to the respective latches 50a and 50b, so each latch 50a, 50b outputs 48 bits of data but the last seven bits are syndrome bits rather than the original ECC check bits from directory 46. The single-bit outputs from all eight ECC checkers collectively become an ECC error signal, ecc_err(0:7). The input address from latch 48d is also fed to each of the comparators, and each comparator outputs a single bit which indicates any match between the input address and the respective directory members. The single-bit outputs from all eight comparators collectively become an 8-bit hit signal, hit(0:7).

The ECC error signal is input to correction sequence logic 56 which takes temporary control of cache directory 40 if any ECC check bit is active. It is necessary to correct any erroneous address fields even if they do not initially appear to match the input address, because the defective bit may be in the address field and could potentially change the result of the comparison. Likewise, even if a cache hit is indicated, a defective bit in the address field or state field could remove the hit after correction, so the error recovery process is undertaken regardless of any address match.

Correction sequence logic 56 examines the ECC error signal and if any ECC check bit is active it selects one of the errant members for error recovery, and outputs an 8-bit signal having only a single active bit which corresponds to the selected member. This output is connected to one input of a multiplexer 58. The other inputs of multiplexer 58 are the 8-bit hit signal and an 8-bit signal from the cache eviction (LRU) logic 59, lru(0:7). LRU logic 59 receives the congruence class bits and picks a member of the set for eviction based on a least-recently used algorithm. Multiplexer 58 is controlled by selection logic 60. Selection logic 60 examines the hit signal and the ECC error signal to determine which of the input signals to pass. If no error has occurred, selection logic 60 will cause multiplexer 58 to pass the hit signal when there is a comparison match or to pass the LRU signal when no match is found. The output of multiplexer 58 is stored in latch 50d.

The eight tags in the indicated congruence class are fed to inputs of another multiplexer 62 during cycle 3. Multiplexer 62 is controlled by the signal from multiplexer 58 via latch 50d. If no error has occurred, the hit or LRU signal from multiplexer 58 will select the appropriate tag necessary to complete the directory operation, which is then passed to latch 64a via multiplexer 62. The index bits pass from latch 50c to another latch 64b during cycle 3, and are combined with 41 data bits from latch 64a during cycle 4 for presentation to cast-out machines 66. The 41 data bits are tag bits 0:40 shown in FIG. 3, i.e., the tag information stored in the directory without ECC check bits. One of the cast-out machines is then used to output the cache line address addr(20:56) to the fabric bus of the microprocessor, or to another cache access bus if there are additional cache levels in the memory hierarchy that get checked before accessing the fabric.

If any error is detected in the directory access by ECC checkers 52a, 52b then correction sequence logic 56 will cause the current directory dispatch access to fail. The correction sequence logic also stops all access to the directory (i.e., read dispatches and write updates) so that it can have exclusive control over the dispatch pipe for this phase of the error recovery process. The errant index address for the failing directory dispatch attempt is passed from latch 50c to latch 64b, through multiplexer 69 and latch 70b, and then steered through congruence class multiplexer 44 so that it arrives at the beginning of the directory dispatch pipe. Multiplexer 69 is controlled by correction sequence logic 56 and is used to hold the errant congruence class member for the duration of the error recovery process so it can be fed down the dispatch pipe at various times.

The error recovery process may include running the errant index down the directory pipe through several passes to evaluate and correct the errant entry. An initial pass is performed by the correction sequence logic to see if the error is still present which is necessary because, even though the initial failing dispatch access found an error, a directory write operation to that location may have occurred between the time of the failing dispatch and the time that correction sequence logic 56 was able to stop all accesses. By first re-checking that the error still exists (if it does), the error recovery process ensures that it is working on the latest contents in a member.

Figures 5, 6:
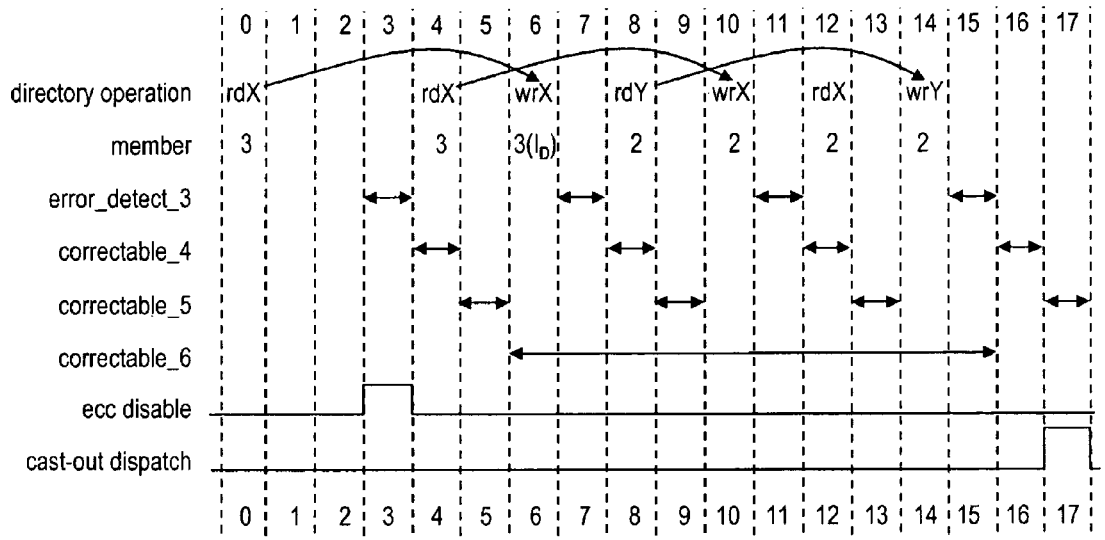
FIG. 5 is a timing diagram for the purge phase of the error recovery process in accordance with one implementation of the present invention.
FIG. 6 is an error-correction code (ECC) matrix which may be used by the ECC logic in the cache directory of FIG. 2 in accordance with one implementation of the present invention.

If any error is detected in the directory access by ECC checkers 52a, 52b, multiplexer 58 will pass the error signal from correction sequence logic 56. If no error is detected the error correction sequence terminates. When an error occurs, multiplexer 62 selects a tag which has an error. In cycle 4, the selected (erroneous) tag and its syndrome are transmitted to an ECC correction circuit 68. ECC checkers 52a, 52b include a hard-wired matrix which produces the error syndrome, while ECC correction circuit 68 includes the same hard-wired matrix to decode the syndrome and correct the errant bit. In the illustrative embodiment, the ECC decoding is used to correct single-bit (correctable) errors and detect double-bit (uncorrectable) errors. A suitable matrix is shown in FIG. 6. Within ECC checkers 52a, 52b, the 48-bit tag is applied separately to each of the seven rows of the matrix in an XOR fashion, to respectively yield the seven bits of the syndrome. For example, the first syndrome bit synd(0) in the decode operation is the XOR combination of bits 0, 2, 3, 4, 6, 7, 8, 9, 10, 11, 16, 20, 23, 25, 26, 30, 33, 35, 38, 40 and 41 of the subject tag (the bits marked with an "x" in the first row of the matrix). If the 48 stored bits are correct, then application of the ECC matrix of FIG. 7 will result in a syndrome of all zeros, to indicate that no correction is necessary. If only one bit is erroneous, the resulting syndrome is decoded to determine which bit is in error, and that bit is corrected by ECC correction circuit 68. For example, if synd(0:7)=0100101, then bit 1 of 0:47 is wrong and needs to be flipped for correction (this syndrome bit pattern matches the column pattern under bit 1 in the matrix). If the syndrome is non-zero but does not match any of the columns, then the error is a double bit error (i.e., uncorrectable in this implementation).

ECC correction circuit 68 sends two signals to correction sequence logic 56 indicating whether a correctable (ce) or uncorrectable (ue) error was found. If an uncorrectable error is indicated, the computer system or subsystem must be halted and correction sequence logic 56 issues a halt command to a system controller (not shown). Alternatively, a more comprehensive error recovery procedure may be instituted, such as reloading values from fault isolation registers. If a correctable error is indicated, the recovery process continues as follows. The output of ECC correction circuit 68 is stored in a latch 70a and the 41 tag bits (without ECC syndrome bits) are recycled to a directory input multiplexer 72 during cycle 5. The index bits are also recycled during cycle 5 from another latch 70b to multiplexer 44. Multiplexer 69 passes the congruence class bits from latch 64b to 70b, and is used to capture and hold the current congruence class. The other input of multiplexer 72 is the directory (L2) write data used by the L2 control logic for normal directory write updates. A 3-bit L2 write set signal is used with such normal directory write updates to indicate which one of the eight members in the set is the target of the operation. This 3-bit signal is an input to a multiplexer 78 whose other input is the write set member csl_set from correction sequence logic 56. The output of multiplexer 78 is connected to another latch 79 which feeds the write set data to L2 directory 46. During error recovery, correction sequence logic 56 transmits a hold signal to multiplexers 44, 69, 72 and 78. Multiplexer 72 thus passes the corrected tag information from ECC correction circuit 68 to an ECC generation circuit 74 which generates new ECC check bits, still during cycle 5. This new (corrected) 48-bit tag is stored in another latch 76.

At this point, L2 directory 46 is triggered by the system clock to write the corrected member into the directory from latch 76. Correction sequence logic 56 starts a second directory access to re-read the tag and see if it was actually corrected in the directory (i.e., check for a stuck bit condition). The old congruence class information is stored in latch 42a during a new cycle 0 via multiplexer 44 and latch 70b. A new directory read cycle 1 repeats as before with the same 8-member set being selected for output from directory 46 based on the previous index. During new cycle 2, if the previous error was not due to a stuck bit, then the directory operation will be completed with normal processing as described above since the error was corrected. However, if the error is due to a stuck bit (hard fault) in the member previously selected for correction, then the same ECC checker 52 will go active. Correction sequence logic 56 keeps track of which member had the previous error and if the same member has a second error, it can be assumed that the error is due to a stuck bit and the member is defective and should no longer be used for further address storage. In this implementation it is assumed that a second error arises from the same bit, but additional circuitry could be provided to keep track of which specific bit was previously erroneous.

The timing for various signals during this error detection and correction phase is illustrated in FIG. 4. The input directory operation (rdX) is evaluated at time interval 0 along with the member number of the defective member which, in this example, is 3 (the member number is a 3-bit value). In time interval 3, the error condition signal (error_detect_3) is evaluated to see if any of the ECC check bits are active. In time intervals 4, 5 and 6, progressively latched signals indicating a correctable error are evaluated, and the corrected data is written back to the directory array in time interval 6 via a write operation (wrX) directed to the same member, representing the end of the first directory pass by the error sequence logic. After a two cycle delay, a second read operation (directory pipe pass) is initiated in time interval 8 to check for the stuck bit. The error condition signal and correctable error signals are again evaluated in time intervals 11, 12, 13, and 14 and the correctable error signal in the last stage (correctable_6) is sampled and held beyond time interval 14 to signify detection of a stuck bit.

Upon detection of a second error/stuck bit, correction sequence logic 56 launches a special stuck-bit correction sequence to correct the tag information and purge the corresponding cache line from the directory, and further mark the defective member with state information indicating that it is no longer to be used. In the illustrative embodiment, cache directory 40 uses the error-correction pipeline circuitry to route a corrected tag to cast-out machines 66. Correction sequence logic 56 places cache directory 40 in a special state which allows directory writes to occur and allows dispatches to be attempted but forces retry responses to any new dispatch attempts. The purpose of this special state is to give the read/claim, cast-out and snoop machines time to finish any operations that are post-dispatch, and ultimately make available cast-out machine as described further below in conjunction with FIG. 7. The erroneous tag is cycled through multiplexer 62 and ECC correction circuit 68 as before, but during execution of the special protocol it is not written back to the same (defective) member in directory array 46. Rather, another member of the same set (a surrogate) is selected by correction sequence logic 56 to temporarily hold the corrected tag in order to allow the tag and its corresponding cache line to be cast-out of the cache memory. The surrogate tag (the tag which is initially contained in the good member that will be used for temporary storage of the corrected tag) is likewise cycled through the error-correction pipeline during the cast-out process. In other words, the pipeline circuitry itself is used as a temporary storage medium for the surrogate tag while the corrected tag is being cast out of the cache. The surrogate member may be selected by toggling a bit in the 3-bit member value.

The timing for various signals during this purge phase is illustrated in FIG. 5. A read operation (rdX) is issued for member number 3 which, in this example, is the defective member. This first read operation places the (uncorrected) tag in the directory pipeline in anticipation of the later write operation which is needed to set special state information and thereby mark the member as defective. In time interval 3, the error condition signal (error_detect_3) is evaluated. However, during time interval 3, error checking is rendered inoperative by activating a disable signal which overrides correction of the tag read in time interval 0. In time interval 4, a correctable error signal is evaluated, and the read operation (rdX) is repeated. This second read operation places the (uncorrected) tag in the directory pipeline in anticipation of the later write operation which temporarily uses the surrogate member. In time interval 5, the next latched correctable error signal is evaluated. In time interval 6, the next latched correctable error signal is sampled and held, and a write operation (wrX) is issued for the defective member 3. This first write operation writes the tag to the defective member with the special state information as discussed below in conjunction with Tables 1 and 2. The error condition signal and first two correctable error signals are evaluated in time intervals 7, 8 and 9, respectively. During time interval 8, another read operation (rdY) is launched, for the surrogate member which in this example is member number 2 (due to toggling of the last bit in the defective member 3-bit value). This third read operation places the surrogate tag in the pipeline for temporary storage during cast-out of the affected memory block. In time interval 10, the write operation (wrX) is issued which writes the corrected tag information into surrogate member. The error condition signal and first two correctable error signals are again evaluated in time intervals 11, 12 and 13, respectively. During time interval 12, another read operation (rdX) is issued in anticipation of the cast-out of the affected memory block. This fourth read operation reads the corrected tag information from the surrogate member. During time interval 14, another write operation (wrY) is issued which writes the surrogate tag back into its original member. The error condition signal and first two correctable error signals are again evaluated in time intervals 15, 16 and 17, respectively, and the last correctable error signal is released in time interval 16. A control signal to the cast-out machines is enabled in time interval 17 to permit a cast-out machine to complete the purge of the affected cache line using the tag information that was read in time interval 12. While the surrogate directory member holds the corrected directory tag, the cast-out data is taken from its original cache entry location in the L2 cache array associated with cache directory 40.

As an alternative to using a surrogate member for the cast out of the affected memory block and storing the surrogate tag in the error-correction pipeline, a multiplexer could be placed before the cast-out machines to select between an uncorrected tag and a corrected tag output from ECC correction circuit 68, but this alternative approach adds undesired latency to the pipeline during normal (non-error) directory access processing.

Figure 7:
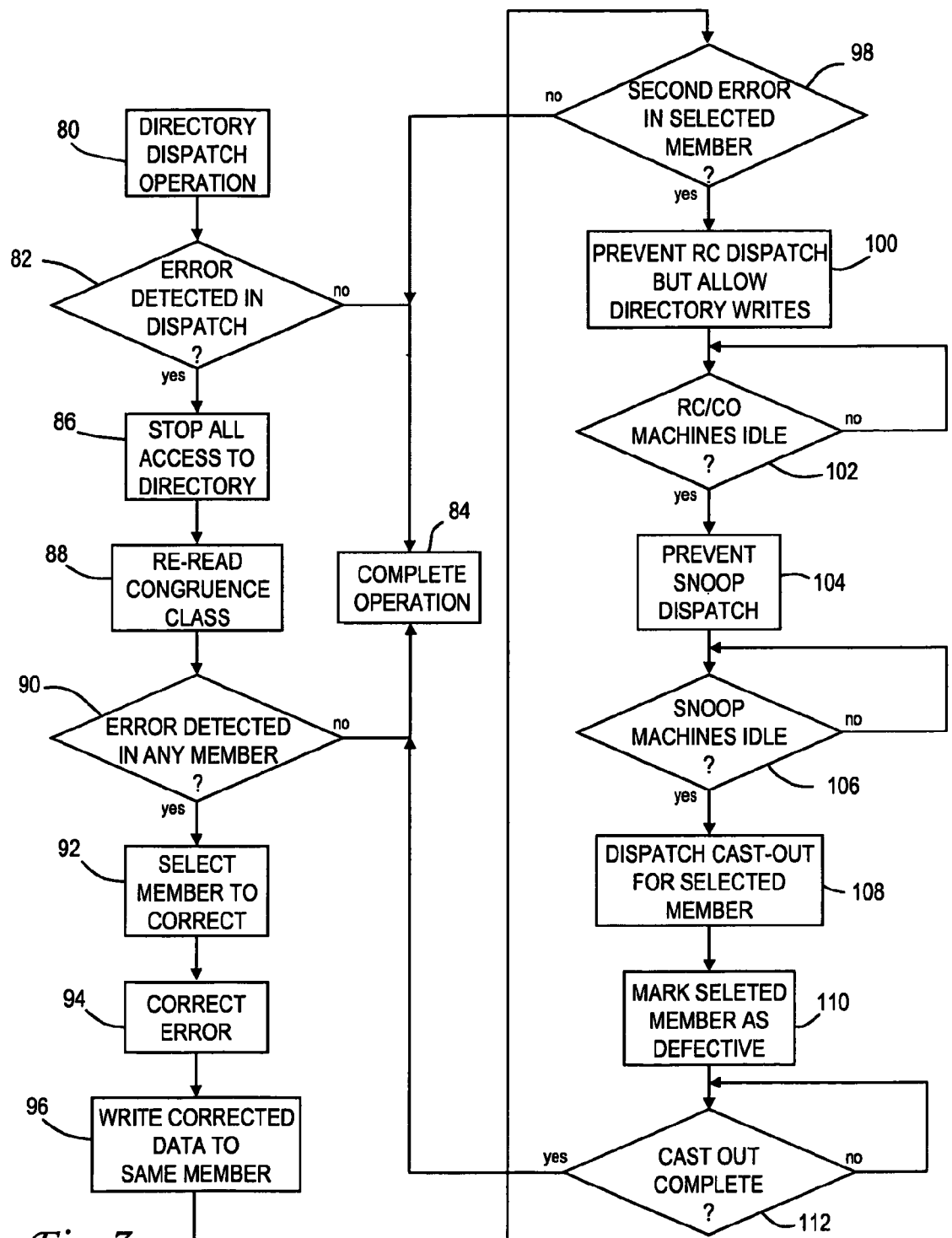
FIG. 7 is a flow chart illustrating error recovery for the cache directory of FIG. 2 in accordance with one implementation of the present invention.

The present invention may be further understood with reference to the flow chart of FIG. 7 which illustrates the entire directory access and error recovery process. The process begins with the dispatch of a directory operation (80). The ECC check bits are examined to see if there is any error detected in any member in the identified set (82). If no error is detected, the operation is completed as normal (84). If an error is detected, all access to the directory is stopped (86), the congruence class information is re-read (88) and another check is made for any error (90). If there is no further error, the operation again completes (84). If there is a further error, one of the erroneous members is selected for correction (92). There may be multiple members with errors, but they are handled one at a time. If only one member has an active ECC bit, that member is selected for correction. The error in the selected member is then corrected (94), and the corrected data is re-written to the same member (96). The ECC check bits are again examined to see if a second error has arisen in the same member (98). If no second error is detected in that same member, the operation completes as normal (84). If a second error is detected it is assumed that the error is a stuck bit. Ongoing directory write operations are allowed to complete prior to purging the affected cache line, but new dispatch operations are inhibited to clear the pipeline for the purge procedure. The correction sequence logic prevents further read/claim (RC) operations from dispatching (100), and waits until all RC and cast-out (CO) machines are idle (102). The correction sequence logic then prevents further snoop operations from dispatching (104), and waits until all snoop machines are idle (106). The purge procedure culminates with the dispatch of a cast-out of the cache line corresponding to the selected/defective member (108), marking of the defective member so that it will not be used for future write operations (110), and completion of the cast-out operation (112).

Situations can arise during the error recovery process wherein the memory system cannot make forward progress due to conflicting operations between different caches ("livelocks"). For example, in the unlikely event that two different processing units or processor cores having different caches both happen to experience a stuck bit and enter the error recovery process near simultaneously, one cache may be waiting for a read/claim operation to return a successful dispatch message, but another cache may be refusing the corresponding RC snoop (issuing retries) because it has suspended the snoop machines for the error correction sequence. A timer can be used to monitor for such situations and can issue a checkstop (halt) to the system if a livelock occurs.

Marking the defective member with a special state to indicate its invalidity is problematic, since one of the state bits may potentially be the stuck bit that is causing the errors. If one of the state bits is faulty, then the process of writing the state information to the member will itself become corrupted, and the state information that is subsequently read for that member will not correspond to the intended state. This scenario is avoided in the present invention by defining multiple binary encodings to indicate a defective cache state, and then selecting one of these multiple encodings based on the location of the stuck bit within the directory member. Table 1 illustrates four binary encodings that are used in accordance with one implementation of the present invention to designate a defective (deleted) directory member.

TABLE 1

| Location of Defective Bit | Invalid-Deleted States | Bit Assignments for $V_0 V_1$ & State bits |
|---|---|---|
| address field | $I_D\_01$ | 0 0 0 0 0 1 |
| state bits | $I_D\_0e$ | 0 0 1 1 1 0 |
| ECC bits | $I_D\_1f$ | 0 1 1 1 1 1 |
|  | $I_D\_2f$ | 1 0 1 1 1 1 |

If the cache eviction (LRU) logic sees any of these $I_D$ states it will never choose that member as a victim for allocation of a new line and hence the defective member will no longer be used.

The particular encoding selected may also depend on the stuck value of the defective bit, i.e., whether it is stuck low ("0") or high ("1"). Table 2 illustrates how the foregoing four different encodings may be applied for different locations and based on the value of the stuck bit.

TABLE 2

| Location of Defective Bit | Invalid-Deleted State for Stuck Bit Value of: 0 | Invalid-Deleted State for Stuck Bit Value of: 1 | Next State of address field |
|---|---|---|---|
| address field (tag bits 8-35) | $I_D\_01$ | $I_D\_01$ | uncorrected |
| $V_0$ (tag bit 5) | $I_D\_01$ | $I_D\_2f$ | 0's |
| $V_1$ (tag bit 36) | $I_D\_01$ | $I_D\_1f$ | 0's |
| state bit 0 (tag bit 37) | $I_D\_01$ | $I_D\_0e$ | 0's |
| state bit 1 (tag bit 38) | $I_D\_01$ | $I_D\_0e$ | 0's |
| state bit 2 (tag bit 39) | $I_D\_01$ | $I_D\_0e$ | 0's |
| state bit 3 (tag bit 40) | $I_D\_0e$ | $I_D\_01$ | 0's |
| ECC bit 0 (tag bit 41) | $I_D\_2f$ | $I_D\_0e$ | 0's |
| ECC bit 1 (tag bit 42) | $I_D\_2f$ | $I_D\_0e$ | 0's |
| ECC bit 2 (tag bit 43) | $I_D\_0e$ | $I_D\_2f$ | 0's |
| ECC bit 3 (tag bit 44) | $I_D\_2f$ | $I_D\_0e$ | 0's |
| ECC bit 4 (tag bit 45) | $I_D\_2f$ | $I_D\_0e$ | 0's |
| ECC bit 5 (tag bit 46) | $I_D\_2f$ | $I_D\_0e$ | 0's |
| ECC bit 6 (tag bit 47) | $I_D\_0e$ | $I_D\_1f$ | 0's |

In writing the tag back to the defective member with the special state encoding, the address field bits are set to zeros in all cases except the first row of Table 2 where the stuck bit is in the address field. For that case, the value written to the directory for tag(8:35) is the uncorrected value (see the disabling of ECC during cycle 3 in FIG. 5). In this manner, if the address field has the stuck bit, the uncorrected address field will match the stuck bit's polarity.

The use of these particular encodings is designed to accommodate the stuck bit in writing the state information, so the stuck bit value will be the same as the value defined for that bit in the selected encoding. For example, if the stuck bit is the $V_0$ bit, there are two encodings defined for the Invalid-Deleted state, $I_D\_01$ or $I_D\_2f$. If the $V_0$ bit is stuck low, the $I_D\_01$ state is used wherein the $V_0$ bit is set to zero; if the $V_0$ bit is stuck high, the $I_D\_2f$ state is used wherein the $V_0$ bit is set to one. In general, for any two or more binary encodings available for a given stuck bit field, one binary encoding has at least some bits that are inverted with respect to the other encoding. The logic for assigning the appropriate $I_D$ state may be included in ECC correction circuit 68, in response to a control signal from correction sequence logic 56.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A computer-implemented method of handling a stuck bit in a directory of a cache memory, comprising:
    defining multiple binary encodings to indicate a defective cache state;
    detecting an error in a tag stored in a member of the directory wherein the tag at least includes an address field, a state field and an error-correction field;
    determining that the error is associated with a stuck bit of the directory member; and
    writing new state information to the directory member wherein the new state information is selected from one of the binary encodings based on a field location of the stuck bit within the directory member.

2. The method of claim 1 wherein the directory includes cache eviction logic to select a member for use with a new cache operation, and the cache eviction logic excludes the directory member from future usage based on the new state information.

3. The method of claim 1 wherein the multiple binary encodings at least include:
   a first binary encoding used for the new state information when the stuck bit is in the address field;
   a second binary encoding used for the new state information when the stuck bit is in the state field; and
   a third binary encoding used for the new state information when the stuck bit is in the error-correction field.

4. The method of claim 1 wherein the new state information is further selected based on a value of the stuck bit.

5. The method of claim 4 wherein the stuck bit is in the state field, and the new state information is selected between a first binary encoding and a second binary encoding having bits that are inverted with respect to the first encoding.

6. The method of claim 5 wherein the new state information is selected between the first binary encoding and the second binary encoding such that a state bit in the directory member corresponding to the stuck bit is assigned a bit value from the new state information which matches the value of the stuck bit.

7. A cache directory comprising:
   a directory array having a plurality of directory members for storing respective tags;
   error detection circuitry which detects an error in a tag stored in one of said directory members, the tag at least including an address field, a state field and an error-correction field;
   correction logic which determines that the error is associated with a stuck bit of said directory member and marks said directory member as defective using new state information, wherein the new state information is selected from multiple binary encodings each of which indicates a defective cache state, based on a field location of the stuck bit within said directory member.

8. The cache directory of claim 7, further comprising cache eviction logic which selects a member for use with a new cache operation, wherein said cache eviction logic excludes said directory member from future usage based on the new state information.

9. The cache directory of claim 7 wherein the multiple binary encodings at least include:
   a first binary encoding used for the new state information when the stuck bit is in the address field;
   a second binary encoding used for the new state information when the stuck bit is in the state field; and
   a third binary encoding used for the new state information when the stuck bit is in the error-correction field.

10. The cache directory of claim 7 wherein the new state information is further selected based on a value of the stuck bit.

11. The cache directory of claim 10 wherein the stuck bit is in the state field, and the new state information is selected between a first binary encoding and a second binary encoding having bits that are inverted with respect to the first encoding.

12. The cache directory of claim 11 wherein the new state information is selected between the first binary encoding and the second binary encoding such that a state bit in said directory member corresponding to the stuck bit is assigned a bit value from the new state information which matches the value of the stuck bit.

13. A computer system comprising:
   one or more processors which process program instructions;
   a memory device; and
   a cache memory connected to said one or more processors and said memory device to temporarily store values that are used by said one or more processors, said cache memory including a cache directory and an array of cache entries corresponding to memory blocks in said memory device, said cache directory having
      error detection circuitry which detects an error in a tag stored in a directory member wherein the tag at least includes an address field, a state field and an error-correction field, and
      correction logic which determines that the error is associated with a stuck bit of said directory member and marks said directory member as defective using new state information, wherein the new state information is selected from multiple binary encodings each of which indicates a defective cache state, based on a field location of the stuck bit within said directory member.

14. The computer system of claim 13 wherein said cache directory further has cache eviction logic which selects a member for use with a new cache operation, wherein said cache eviction logic excludes said directory member from future usage based on the new state information.

15. The computer system of claim 13 wherein the multiple binary encodings at least include:
   a first binary encoding used for the new state information when the stuck bit is in the address field;
   a second binary encoding used for the new state information when the stuck bit is in the state field; and
   a third binary encoding used for the new state information when the stuck bit is in the error-correction field.

16. The computer system of claim 13 wherein the new state information is further selected based on a value of the stuck bit.

17. The computer system of claim 16 wherein the stuck bit is in the state field, and the new state information is selected between a first binary encoding and a second binary encoding having bits that are inverted with respect to the first encoding.

18. The computer system of claim 17 wherein the new state information is selected between the first binary encoding and the second binary encoding such that a state bit in said directory member corresponding to the stuck bit is assigned a bit value from the new state information which matches the value of the stuck bit.

* * * * *